(12) United States Patent
Venkateshwaran et al.

(10) Patent No.: US 6,339,254 B1
(45) Date of Patent: Jan. 15, 2002

(54) STACKED FLIP-CHIP INTEGRATED CIRCUIT ASSEMBLAGE

(75) Inventors: Vaiyapuri Venkateshwaran; Ji Cheng Yang, both of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/387,750

(22) Filed: Aug. 31, 1999

(30) Foreign Application Priority Data

Sep. 1, 1998 (SG) ............................................. 9803382

(51) Int. Cl.⁷ ............................................. H01L 23/48
(52) U.S. Cl. ........................ 257/686; 257/737; 257/778
(58) Field of Search ........................ 257/723, 731–737, 257/738, 777, 779, 693, 686, 778

(56) References Cited

U.S. PATENT DOCUMENTS

| | | | | |
|---|---|---|---|---|
| 5,977,640 A | * | 11/1999 | Bertin et al. ................ | 257/777 |
| 6,127,726 A | * | 10/2000 | Bright et al. ................ | 257/691 |
| 6,137,164 A | * | 10/2000 | Yew et al. ................... | 257/686 |
| 6,147,401 A | * | 11/2000 | Solberg ....................... | 257/723 |
| 6,150,724 A | * | 11/2000 | Wenzel et al. .............. | 257/777 |

FOREIGN PATENT DOCUMENTS

JP  10 163263 A  * 6/1998

* cited by examiner

Primary Examiner—Nathan Flynn
Assistant Examiner—Ahmed N. Sefer
(74) Attorney, Agent, or Firm—Gary C. Honeycutt; Fred Telecky; Arthur I. Navarro

(57) ABSTRACT

A stacked multichip assemblage including a plurality of integrated circuit die directly attached to a substrate having pads corresponding to terminals on the die, and interconnections between the die, and also to external contacts. The stacked integrated circuit arrangement includes a first chip (s) having an array of bumped terminals positioned on the corresponding pads of the substrate, a larger integrated circuit chip having perimeter bump terminals located over the first chip, and the terminals directly bonded to corresponding pads on the substrate.

9 Claims, 3 Drawing Sheets

STACKED FLIP-CHIP INTEGRATED CIRCUIT ASSEMBLAGE

CROSS-REFERENCE TO APPLICATIONS

This application is related to co-assigned Application Ser. No. 60/078056, Mar. 16, 1998.

FIELD OF THE INVENTION

This invention relates generally to the field of integrated circuit devices, and in particular to an arrangement for integrated circuit assembly.

BACKGROUND OF THE INVENTION

Maximizing performance, lowering cost and increasing the density of integrated circuits are ongoing goals of the electronics industry. In particular, portable systems, such as computers and telecommunications have spurred the efforts to define reliable technology for supplying circuits in the smallest possible area, and for many applications with increased operating speed.

Advances in interconnect technology have provided the key enablers toward these ends. Direct connection of the active surface of a semiconductor die to a substrate or package, using solder balls for flip-chip attachment, furnished the basic technology for low inductance, area array assembly of integrated circuits. This technology developed years ago has surged recently as more practical means of forming and attaching bump terminals has evolved. New methods including plating solders, or using solder or conductive polymers to adhere conductive spheres or columns to pads on the device have begun to replace the original process of evaporating and patterning solders.

Not only are chips attached to substrates by flip-chip connections replacing wire bonding, but ball grid array (BGA) and chip scale packages (CSP) are attached to boards or other next level interconnection by means of balls or bumps, rather than by leads. Ball sizes vary from those in the range of 75 microns used for flip-chip attachment to those greater than a millimeter in diameter for CSP and BGA attachment. FIG. 1 provides a cross sectional view of a prior flip-chip 105 assembly in a BGA package 106, and demonstrates the use of different ball sizes, i.e. solder balls 115 on the flip-chip assembly typically yield a stand off height of about 65 microns, whereas balls 116 on the BGA package have about 0.9 mm stand off. Not only is performance enhanced by lower inductance of short, wide ball connections, versus long, thin wire bond or lead conductors, but arraying the terminals in the area under the device, rather than at the perimeter minimizes space, and thereby supports increased packing density.

While bump or ball interconnect technology allows a mechanism for low inductance assembly of semiconductor devices, multichip modules provide a means for fabricating subsystems by interconnecting chips on a common substrate or package. FIG. 2 demonstrates an example of such an assemblage wherein a die 201 may be connected by flip-chip terminals 202 or by wire bonds 203 to the substrate. The substrate 211 provides the wiring connection both between the chips within the assembly, and to external contacts 230 which in turn contact the next level of interconnection, such as a printed wiring board 220. In multichip assemblies interconnections between chips often provides a means for decreasing the total number of output pins on the module, as compared to the number required for individual components, and thereby decreases the printed circuit board space required. Performance is enhanced as a result of shorter interconnections with lower inductance. In addition, common power and ground lines further decrease the input/outputs requirements and provide enhanced performance; multichip modules having multilevel substrates frequently include such designs.

Another technique for increasing density of integrated circuit devices has been stacked packages and/or stacked chips. Double-sided printed wiring boards with surface mount packages on each side was a forerunner of stacking packages face-to-face. There have been many iterations of stacked assemblies, including memory modules either as chips or packaged devices wherein the devices of similar device size and type are stacked back-to-front with vertical electrical interconnections on the perimeter.

Alternately, chips have been stacked face-to-face on a common wiring board. One such assembly, shown in FIG. 3 provides a first flip-chip 301 positioned face-to-face with a second flip-chip 302 on a substrate 303 interposed between the chips to provide electrical connection 313 among the flip-chip terminals 311, and to external circuitry 315. However, this assembly uses a flex circuit as the interposer 303 between the facing flip-chips and requires a separate mechanical support 320, which in turn has contact connections to the next level of interconnection. This results in a complex assembly.

It would be advantageous to develop a technique for increasing the packing density of integrated circuits which takes advantage of the low inductance of ball connections, the decreased number of input/output contacts as found with multichip or stacked assembly, good thermal dissipation, and the low cost of standardized packaging technology.

SUMMARY OF THE INVENTION

It is the primary object of the present invention to provide a novel packaging structure for improvement of packing density and performance of integrated circuits. The above and other objects, features and advantages of the present invention will be apparent from the following descriptions.

It is an object of this invention to provide a high density multichip assemblage wherein the active circuits are within the area of the largest single integrated circuit device in said assemblage.

The device of this invention includes two or more integrated circuit dice having flip-chip terminals, and a rigid substrate having a surface with printed wiring interconnections and a plurality of flip-chip pads. The device provides that a die having perimeter bump terminals is located on top of a smaller die or dice having bump terminals, bumps from all dice are aligned to pads on the substrate, and are electrically connected.

It is further an object of this invention to provide a stacked multichip assemblage having multiple packaging options, including BGA, CSP, cavity down BGA, cavity down CSP, Board-on-Chip(BOC), or chips directly attached to a printed wiring board. The assemblages may be encapsulated by a protective material such as an epoxy or ceramic layer, which in turn may have heat spreaders attached for improved thermal performance, but it should be noted that the encapsulation layer is not required to effectuate the purpose of the present invention.

It is also an object of this invention to provide a stacked flip-chip device wherein the effects of thermally induced mechanical stress on the bump terminals is minimized by having larger bumps on those die with maximum thermal mismatch to the substrate, and further reducing the effects of stress by encasing the bump connections of all die with an underfill material.

Another object of the invention is to provide a stacked multichip assemblage having good thermal dissipation as a result of multiple thermal conduction paths.

It is an object of this invention to provide a stacked chip assembly having low inductance advantages realized from bump connections, and from short interconnections between chips.

It is still further an object of this invention to provide a stacked flip-chip assembly which is capable of having fewer external input/output connections than would be required for each of the individual chips.

It is yet another objective of this invention that the bump terminals comprise electrically and thermally conductive materials, wherein provisions can be made for an assembly thermal hierarchy.

It is still further an objective of this invention to provide a stacked flip-chip assembly wherein the largest chip has perimeter contacts, and the smaller chips have latitude for perimeter, center or area arrayed terminals.

In accordance with the present invention, there is provided a method for forming the mechanical and electrical connection of the multiple chips of the stacked flip-chip assembly to the substrate in a single reflow process. The technique is applicable to packaging options such as BGA, CSP and/or directly attached to a printed circuit board.

The drawings constitute a part of this specification and include exemplary embodiments to the invention which may be embodied in various forms. It is to be understood that in some instances aspects of the invention may be shown exaggerated or enlarged to facilitate and understanding of the invention.

DETAILED DESCRIPTION OF THE PREFERRED EMBODIMENT

Figure 1:
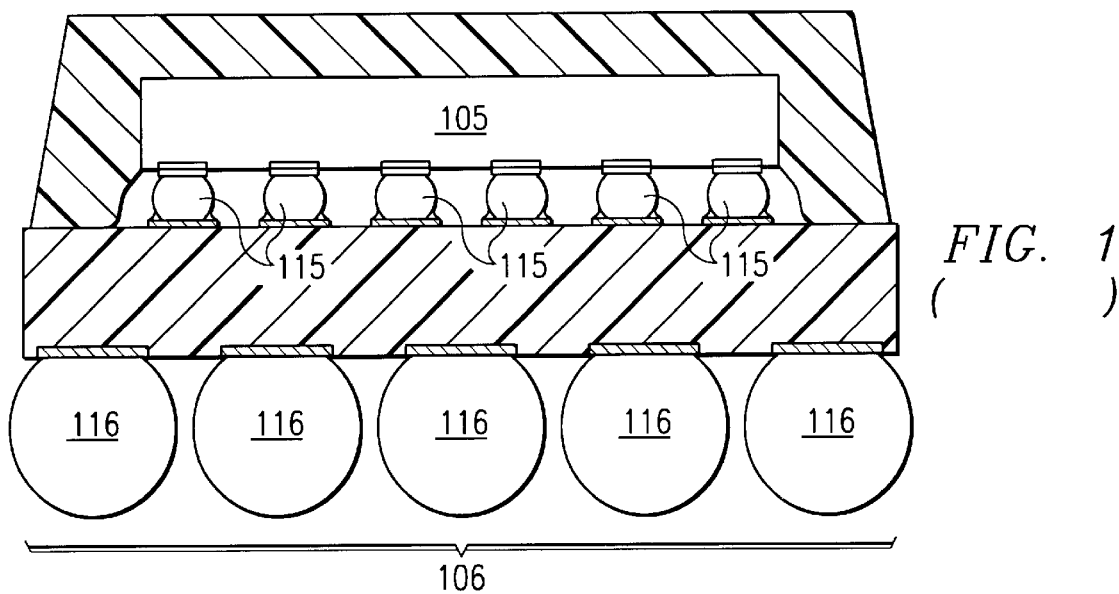
FIG. 1 demonstrates a flip-chip device in a BGA package (Prior art)
Figure 2:
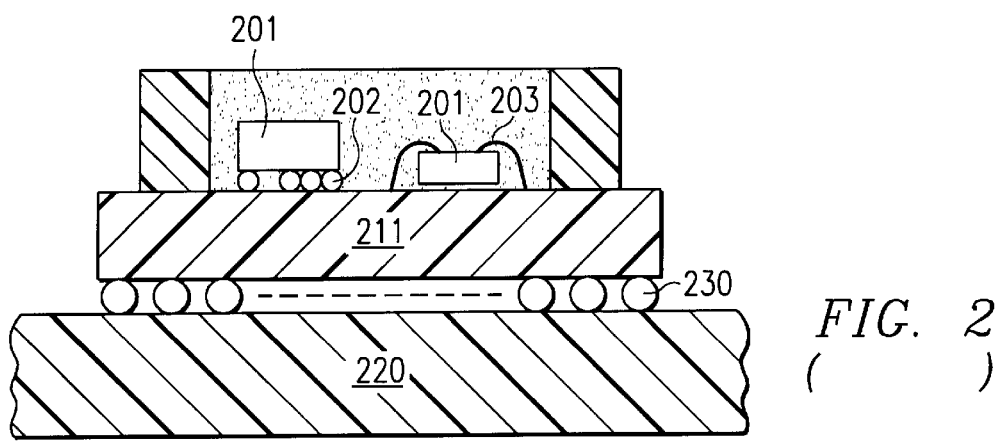
FIG. 2 shows a cross section of a multichip module. (Prior art)
Figure 3:
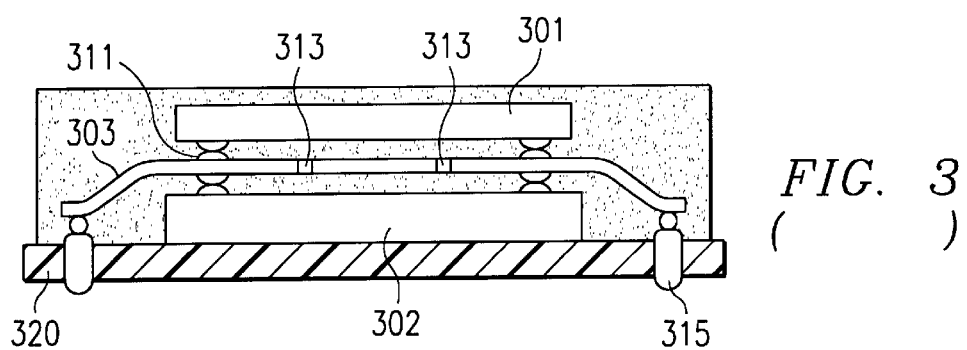
FIG. 3 demonstrates a stacked chip on flex interposer package. (Prior art)
Figure 4:
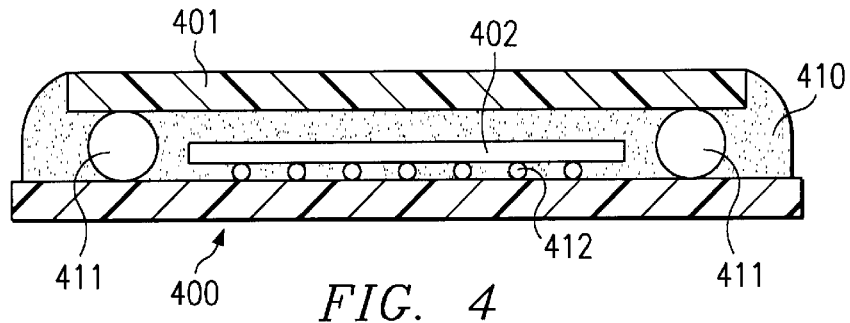
FIG. 4 is a cross sectional view of the present invention.

Turning now to the drawings which describe the current invention. FIG. 4 shows a cross section of a stacked flip-chip device assembled on a substrate 400. The device comprises integrated circuit dice 401 and 402, wherein each die having bump terminals for direct flip-chip interconnection on the active surface and the active circuits are contained within the area of the largest die in the assemblage. Die 401 is located over die 402 and both dice are electrically connected to pads on one surface of a substrate; said pads correspond to bump terminal locations on the dice. Metal traces connect the substrate pads to a plurality of external contacts (not shown). A major advantages of providing such an arrangement of stacked multichips wherein one die is located over top of the second die and both die are directly attached to a single surface of the substrate is realized in that only one substrate interconnection surface is required.

The bump terminals 411 of integrated circuit die 401 are located around the perimeter of the die, and the area inside the bump terminals is greater than the total surface area of semiconductor die 402. Bump terminals on die 401 provides stand-off clearance between the active surface of die 401 and the backside of die 402 after all terminals have been connected to the substrate.

In practice, the diameter of flip-chip bumps is limited by the density of chip pads and the chip size. In the preferred embodiment, bumps on die 401 are larger than those on die 402. The bump terminals of die 402 are consistent with the size of those on existing flip-chip die, typically 0.05 to 0.25 mm in diameter. Die 401 spans a greater distance than die 402; its terminal connections are subjected to larger thermally induced stresses arising from expansion mismatches between chip and the substrate and therefore, the bump contact dimensions are increased in order to minimize the effect of said stresses. The bump terminals of die 401 in the preferred embodiment are in the range of 0.25 to 0.6 mm.

In the preferred embodiment of this invention, not only is the bump contact area made as large as possible on the larger die 401 in order to enhance reliability of the solder joints, but stress reduction is further assured by the presence of a filled thermosetting plastic compound generically referred to as "underfill" 410 which surrounds the bumps and absorbs some stresses arising from thermal mismatch. Solder fatigue which can result from mismatch in expansion coefficient and Young's modulus between the substrate and the silicon die is greatest at the furthermost point from the center of the assembly, but a relatively low expansion underfill polymer has been shown to mitigate such thermally induced stress. Therefore, the preferred embodiment includes a polymer compounded with a low expansion filler completely surrounding all bumps in the assemblage.

In densely packed multichip modules, heat from active circuits can be a serious reliability issue. In order to effectively resolve the problem, multiple thermal conduction paths from each die are needed. The underfill material 410 comprises a thermosetting polymer compounded with thermally conductive, electrically insulating particles which serve not only to lower expansion, but also to dissipate heat from the surfaces of the dice. Thermally conductive underfill allows localized heat from the active circuits to be spread and conducted away from the source. In the preferred embodiment, the underfill surrounds the smaller dice, contacts the active surface of the larger die, and thereby provides a thermal path to the outside of the package for each integrated circuit. Heat from both the active surface of die 402, as well as the backside is dissipated into the underfill. In addition, high thermal conductivity paths are provided from each die to the substrate by way of bumps which are not only electrically conductive, but are also highly thermally conductive, such as lead/tin solders. Further, thermal conduction paths may also be provided by high thermal dissipation packaging options.

In practice, tolerances of the printing wiring technology used for the substrate coupled with the pad pitch on die 401 dictate allowable bump diameter for die 401. Bumps of the larger die 401 create a stand-off space between the active surface of said die and the backside of die 402, as well as the space for underfill material 410. For those devices allowing a maximum of 0.35 mm diameter bumps, it is necessary to control the thickness of die 402 to 0.2 mm or less.

Integrated circuit die are typically 0.25 to 0.5 mm in thickness, but for thin packages, it is not unusual for integrated circuit wafers to be thinned to 0.15 mm. In the embodiment shown in FIG. 4, the surface of the substrate 400 having a plurality of pads which correspond to the flip-chip terminals is at single height, thereby requiring die 402 to be thinned sufficiently to assure clearance between the backside of die 402 and the active surface of die 401.

Figure 5:
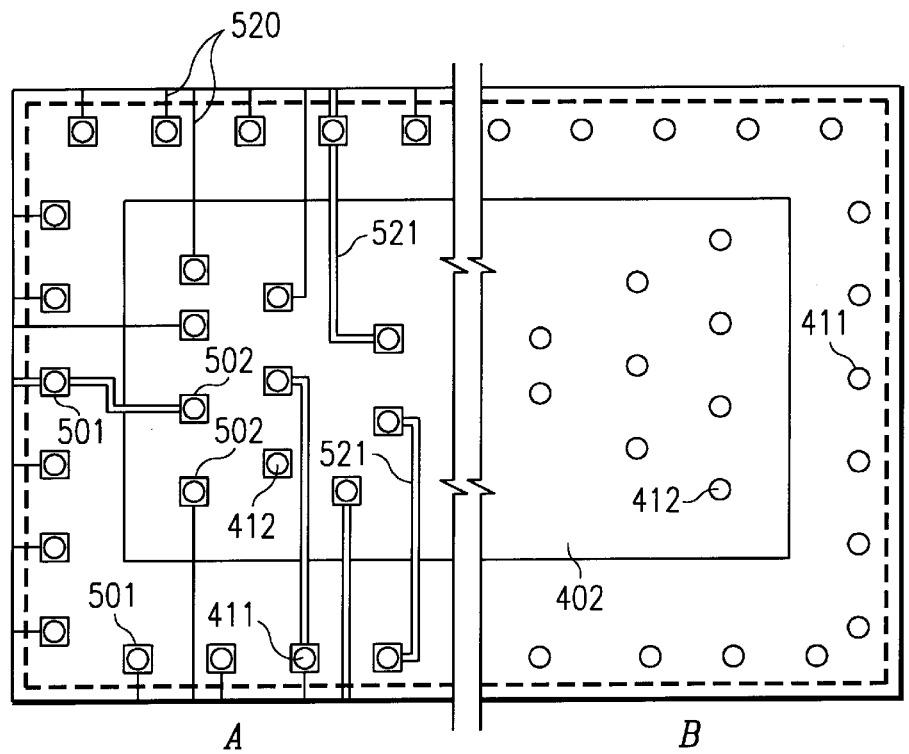
FIG. 5 shows a substrate contact pattern for a stacked chip assembly of the present invention.

To further explain the device of the current invention, FIG. 5 depicts on side "A" an example of the substrate 400 including a simple conductor pattern and contact pads, and the stacked flip-chips of this invention. For reference, side "B" of FIG. 5 shows only the bump terminals 411 and 412 of dice 401 and 402 respectively. The bump terminals 412 of die 402 are aligned to pads 502 on the substrate, and the terminals 411 of die 401 are aligned to substrate pads 501. Bump terminals of die 402 may be located on the perimeter, area arrayed, or may have center bond pads as are typical of DRAM devices. For the large die 401 bump terminals 411 are located at or near the perimeter of die 401 to allow clearance for die 402.

Substrate conductors are metallic traces 520 typically comprised of copper which interconnect circuits within the flip-chip assemblage, and between each of the integrated circuits and an external contact point. In the example depicted in FIG. 5 the traces are configured to be contacted at the device edge, with some lines 521 to provide connection between die 401 and die 402. Interconnections between chips serve both to decrease the total number of external contacts required for the system, and to provide very short conductor lengths between chips. The potential for high speed performance of the device of this invention is supported by short interconnections and by low inductance bump contacts.

Multilayer substrates (not shown) are a means to further reduce the number of input/output connections by including common ground and/or power planes. Some packaging options which are applicable to this invention are commercially available which multilevel substrates. Performance, reduced area and thermal dissipation are improved by such metal rich planes.

Figure 6A:
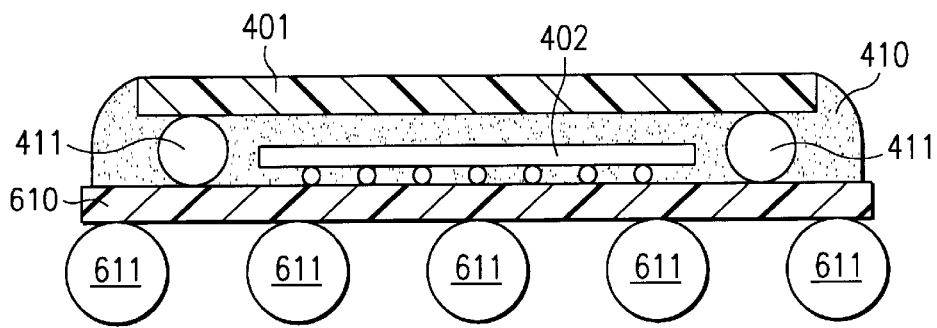
FIG. 6A demonstrates a cross sectional view of a BGA/CSP package with stacked flip-chips.

FIG. 6A depicts the preferred embodiment of this invention. It comprises a BGA (Ball Grid Array) or CSP (Chip Scale Package) substrate 610 and a flip-chip assemblage having a larger die 401 with perimeter bumps located on top of a smaller flipchip die 402. While there are many different types of Chip Scale Packages, for purposes of this specification, package size and interconnection dimensions are inferred as the difference between BGA and CSP package types, and they will be presented as either BGA or CSP. The required feature of either package is that the substrate 610 provides a printed wiring surface having contact pads for the flip-chip bump terminals, interconnections between the chips, and interconnections to the external circuitry. Vias (not shown) to solder bumps 611 on the opposite surface of said substrate contact the next level of interconnection, such as a printed wiring board. Variations of BGA/CSP devices may have single or multilevel substrates, either of which is amenable to this assemblage.

Figure 6B:
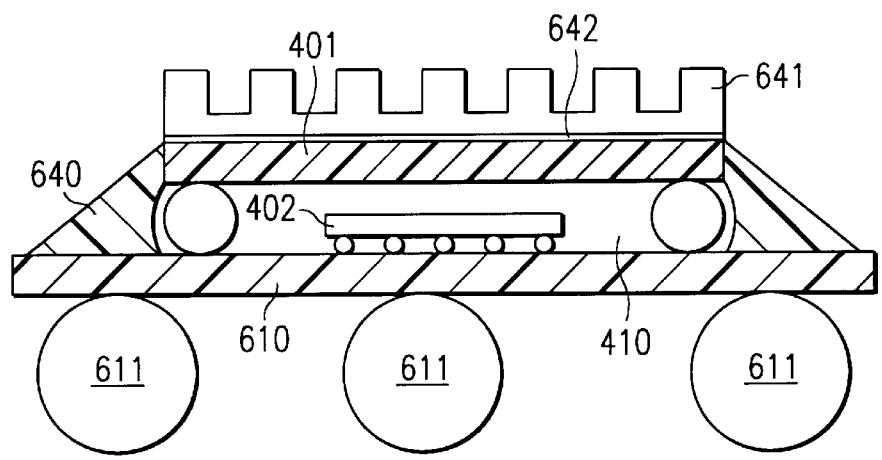
FIG. 6B demonstrates a cross sectional view of an encapsulated BGA/CSP package with an attached heat spreader.

Mechanical and environmental protection of the stacked multichip device in a BGA/CSP packages may be offered by encapsulation in a plastic molding compound by transfer or vacuum molding, a ceramic shell or premolded plastic shell filled with a potting polymer. FIG. 6B shows an example of a molded plastic BGA 640 with a heat spreader 641 attached by a thermally conductive adhesive 642 to the backside of die 401 to further dissipate heat away from the active devices. It should be noted that the encapsulation is not required to effectuate the purpose of the present invention.

Figure 6C:
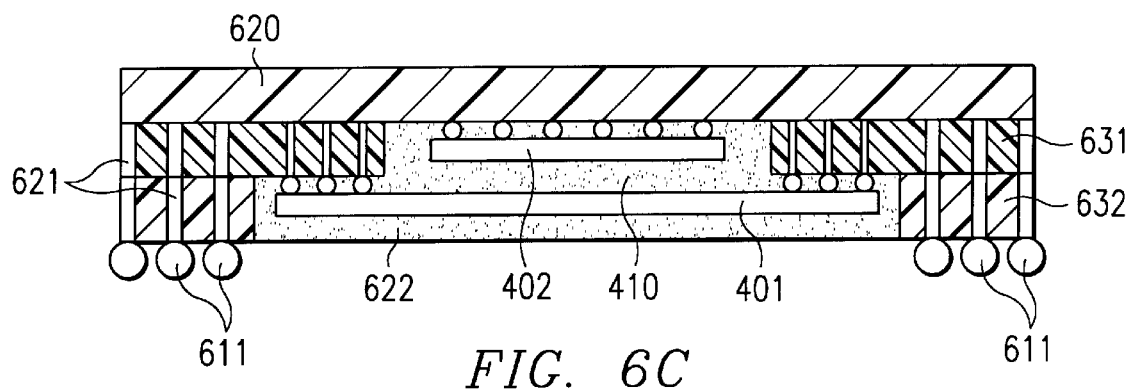
FIG. 6C demonstrates a cross sectional view of a Cavity down BGA/CSP with stacked flip-chips.

FIG. 6C demonstrates an alternate packaging option wherein the substrate 620 comprises the first level of interconnection of a cavity down BGA/CSP package. Cavity down BGA packages are characterized by having die attached to a substrate, conductors are routed to the perimeter where vias 621 contact a second 631, third 632, or more (not shown) interconnect levels, which in turn are routed to BGA bump terminals 611. The cavity formed by multiple interconnection levels on the package perimeter is typically filled with a filled epoxy 622, and a heat spreader (not shown) may be attached to the substrate surface opposite the flip-chip assemblage. The assembled package is attached to the next level of interconnection, such as printed wiring board, with the cavity facing the board. A cavity down BGA/CSP package may be very well suited for this stacked flipchip assemblage in the case where chip 401 is correctly sized to be attached to the second 631 interconnect level, and the smaller chip 402 or chips are positioned on the first level of the substrate 620. In the example depicted in FIG. 6C wherein die 401 is attached to the second level of interconnection, the multilevel structure allows additional degrees of latitude in the dimensional requirements of components of his multichip device, such as thickness of die 402 may be increased, bump diameter of said die 402 may be maximized, and more space is allowed for underfill compound 410 as a result of the additional standoff height created by the second interconnect level.

The bump terminals of dice 401 and 402 comprise a highly electrically conductive material. In the preferred embodiment said bumps comprise solder having a liquidus temperature greater than the reflow temperature of eutectic solder, about 183 degC. Higher reflow temperature of the flip-chip devices insures that the die do not move significantly during assembly of the BGA package to the printed wiring board. Solder balls 611 on the opposite surface of the BGA/CSP substrate from the flip-chip assembly are typically eutectic solder, and the infrastructure for assembly of such packages to the next level of interconnection is well established.

Further, in the preferred embodiment, flip-chip bumps of die 401 and of die 402 comprise the same material so that all dice of the multichip assemblage are electrically and mechanically connected to the substrate in the one thermal attachment process.

Alternate materials for bump terminals of die 401 and 402 are conductive polymers, lead free solders, composite balls attached by means of either solder or conductive polymers. A number of composite bumps have been disclosed previously in a related disclosure from Texas instruments, Inc. in U.S. Ser. No. 60/078056, filed Mar. 16, 1998 which is included herein by reference.

Figure 7:
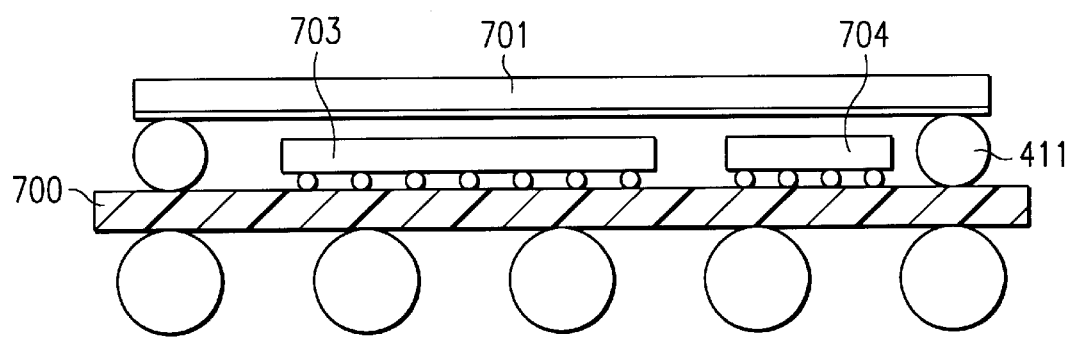
FIG. 7 demonstrates a stacked flip-chip assembly with greater than two chips.

A further embodiment of the present invention is demonstrated in FIG. 7 wherein multiple dice 703 and 704 are placed on the substrate 700 and die 701 is located over top of both smaller dice. Said assemblage having more than two active integrated circuits comprises bumped die and a substrate having the same materials and limitations as the assemblages shown in FIGS. 4, 5, and 6A 6B and 6C.

Turning now to a method for fabricating a stacked multichip assemblage of the preferred embodiment of this invention, a BGA substrate 610 having a plurality of pads which correspond to the bump input/output terminals of die 401 and die 402 is treated with solder flux to coat each pad. The bump terminals of die 402 are aligned to and brought into contact with their respective pads on said substrate using flip-chip alignment equipment known in the industry, and the die is temporarily held in its correct position by the flux. In a similar manner, the bump terminals of die 401 are aligned to and brought into contact their respective pads, and the thixotropic nature of the flux holds the die in place. The assemblage is passed through a heating apparatus suitable for flip-chip processing which has been programmed with a thermal cycle specified for reflowing the solder bumps and for cooling the assemblage. An underfill material 410 is applied, allowed to flow under chip 401 and 402 before heating to set the compound. The BGA package assembly is completed using materials and processes typical in the industry and as specified by the manufacturer.

In summary, the present invention provides a novel integrated circuit assemblage which supports very high density and high performance needs in a stacked multichip package. The device of this invention places the smaller chip(s) of the system face down on a printed wiring substrate, and a larger die is located face down over top of the first. Simultaneous reflow of all chips supports low cost assembly needs.

While the invention has been described in connection with preferred embodiments, it is not intended to limit the scope of the invention to a particular form set forth, but on the contrary, it is intended to cover alternatives, modifications, and equivalents as may be included within the spirit of the invention within the spirit and scope of the invention as defined by the appended claims.

What is claimed is:

1. A stacked multichip device comprising a larger circuit die having solder bumped terminals near the die perimeter, one or more smaller solder bumped integrated circuit dice, and a substrate having printed wiring conductors for interconnection between said dice and external contacts; wherein a) said substrate includes a surface having a plurality of outer contact pads aligned with the input/output pads of said larger die, and a plurality of inner contact pads aligned with the input/output pads of said smaller die or dice, b) one or more of said smaller integrated circuit dice contacting the pads on said substrate inside said perimeter defined by the bumped terminal connectors of the larger die, and c) said larger circuit die is located over the smaller die and is connected to said outer substrate pads.

2. A device as in claim 1 wherein said bumped terminals of each integrated circuit dice comprise the same material, thereby having the same thermal properties so that all electrical and mechanical contacts may be made simultaneously.

3. A device as in claim 2 wherein said bump terminals have higher liquidus temperature that eutectic solder.

4. A device as in claim 1 wherein the bump terminals of the largest device in the system are larger than the bump terminals of the smaller dice.

5. A device as in claim 1 wherein said substrate comprises the base of a BGA package.

6. A device as in claim 1 wherein the substrate comprises a Chip Scale Package having a rigid, wiring board substrate.

7. A device as in claim 1 wherein the substrate comprises a Chip-on-Board package structure.

8. A device as in claim 1 wherein said bump terminals of each smaller die are located in an area array, perimeter, center contacts or any combination thereof.

9. A stacked multichip device comprising a larger circuit die having bumped terminals near the die perimeter, one more smaller bumped integrated circuit dice, and a substrate having printed wiring conductors for interconnection between said dice and external contacts; wherein a) said substrate having a surface with a plurality of outer contact pads corresponding to the input/output pads of said larger die, and a plurality of inner contact pads corresponding to the input/output pads of said smaller die or dice, b) one or more of said smaller integrated circuit die contacting the pads on said substrate inside said perimeter defined by the bumped terminal connectors of the larger die, and c) said larger circuit die is located over the smaller die and is connected to said outer substrate pad; and d) said bumped terminals of each integrated circuit dice comprise the same material, thereby having the same thermal properties so that all electrical contacts may be made simultaneously.

* * * * *